United States Patent
Camillo-Castillo et al.

(10) Patent No.: US 9,159,817 B2
(45) Date of Patent: Oct. 13, 2015

(54) HETEROJUNCTION BIPOLAR TRANSISTORS WITH AN AIRGAP BETWEEN THE EXTRINSIC BASE AND COLLECTOR

(71) Applicant: International Business Machines Corporation, Armonk, NY (US)

(72) Inventors: Renata Camillo-Castillo, Essex Junction, VT (US); Vibhor Jain, Essex Junction, VT (US); Vikas K. Kaushal, Essex Junction, VT (US); Marwan H. Khater, Astoria, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/083,769

(22) Filed: Nov. 19, 2013

(65) Prior Publication Data

US 2015/0137185 A1 May 21, 2015

(51) Int. Cl.
*H01L 29/66* (2006.01)
*H01L 29/73* (2006.01)
*H01L 29/737* (2006.01)

(52) U.S. Cl.
CPC ...... *H01L 29/7371* (2013.01); *H01L 29/66242* (2013.01)

(58) Field of Classification Search
CPC ... H01L 29/66; H01L 29/737; H01L 29/7371; H01L 29/66242; H01L 29/73; H01L 21/331; H01L 29/735; H01L 29/6625
See application file for complete search history.

(56) References Cited

U.S. PATENT DOCUMENTS

| | | | |
|---|---|---|---|
| 5,525,817 A | 6/1996 | Hill et al. | |
| 5,683,919 A * | 11/1997 | Tserng | 438/122 |
| 5,789,301 A | 8/1998 | Hill | |
| 6,940,149 B1 * | 9/2005 | Divakaruni et al. | 257/565 |
| 6,964,907 B1 | 11/2005 | Hopper et al. | |
| 7,190,046 B2 | 3/2007 | Akatsu et al. | |
| 7,816,221 B2 | 10/2010 | John et al. | |
| 8,067,290 B2 | 11/2011 | Boeck et al. | |
| 2002/0190351 A1 * | 12/2002 | Freeman et al. | 257/592 |
| 2003/0207512 A1 * | 11/2003 | Hsu | 438/200 |
| 2005/0212087 A1 * | 9/2005 | Akatsu et al. | 257/565 |
| 2010/0187657 A1 * | 7/2010 | Boeck et al. | 257/593 |
| 2011/0215417 A1 | 9/2011 | Meunier-Beillard et al. | |
| 2014/0151852 A1 * | 6/2014 | Adkisson et al. | 257/565 |
| 2014/0327111 A1 * | 11/2014 | Camillo-Castillo et al. | 257/586 |

(Continued)

FOREIGN PATENT DOCUMENTS

| JP | H06338515 A | | 12/1994 |
|---|---|---|---|
| JP | 09036131 | * | 2/1997 |
| JP | 2003347310 | * | 5/2002 |

(Continued)

*Primary Examiner* — Tan N Tran
*Assistant Examiner* — Fazli Erdem
(74) *Attorney, Agent, or Firm* — Thompson Hine LLP; Anthony J. Canale

(57) ABSTRACT

Fabrication methods, device structures, and design structures for a heterojunction bipolar transistor. A collector is formed in a semiconductor substrate, an intrinsic base is formed on the semiconductor substrate, and an extrinsic base is formed on the intrinsic base. An airgap is located vertically between the extrinsic base and the collector. A contact surface is located adjacent to the airgap. The contact surface is coupled with the collector. A spacer is located laterally between the airgap and the subcollector contact surface.

20 Claims, 18 Drawing Sheets

(56) References Cited

U.S. PATENT DOCUMENTS

2014/0353725 A1* 12/2014 Adkisson et al. ............ 257/197
2015/0021738 A1* 1/2015 Camillo-Castillo et al. .. 257/565

FOREIGN PATENT DOCUMENTS

| JP | 2003-347310 A | 12/2003 |
|----|---------------|---------|
| WO | 03096404 A1 | 11/2003 |

* cited by examiner

HETEROJUNCTION BIPOLAR TRANSISTORS WITH AN AIRGAP BETWEEN THE EXTRINSIC BASE AND COLLECTOR

BACKGROUND

The invention relates generally to semiconductor device fabrication and, in particular, to heterojunction bipolar transistors, as well as fabrication methods and design structures for a heterojunction bipolar transistor.

Bipolar junction transistors are three-terminal electronic devices that include three semiconductor regions defining an emitter, an intrinsic base, and a collector. Heterojunction bipolar transistors are a variant of bipolar junction transistors in which at least two of the semiconductor regions are comprised of different materials. An NPN heterojunction bipolar transistor includes two regions of n-type semiconductor material constituting the emitter and collector, and a region of p-type semiconductor material sandwiched between the two regions of n-type semiconductor material to constitute the intrinsic base. A PNP heterojunction bipolar transistor includes two regions of p-type semiconductor material constituting the emitter and collector, and a region of n-type semiconductor material sandwiched between the two regions of p-type semiconductor material to constitute the base. The differing conductivity types of the emitter, base, and collector define a pair of p-n junctions, namely a collector-base junction and an emitter-base junction, across which the conductivity type changes. A voltage applied across the emitter-base junction controls the movement of charge carriers that produces charge flow between the collector and emitter.

Heterojunction bipolar transistors may be found, among other end uses, in high-frequency and high-power applications. In particular, heterojunction bipolar transistors may be used in radiofrequency integrated circuits, which are found in wireless communications systems, power amplifiers in cellular telephones, and other varieties of high-speed end uses. To take advantage of the positive characteristics of both transistor types, heterojunction bipolar transistors and CMOS field effect transistors may be combined in a single chip to form a BiCMOS integrated circuit.

Improved device structures, fabrication methods, and design structures are needed for enhancing the performance of heterojunction bipolar transistors.

SUMMARY

In an embodiment of the invention, a method is provided for forming a device structure for a heterojunction bipolar transistor. The method includes forming a collector in a semiconductor substrate, forming an intrinsic base layer on the semiconductor substrate, and forming an extrinsic base layer on the intrinsic base layer. An airgap is formed vertically between the extrinsic base layer and the collector. The method further includes forming a contact surface adjacent to the airgap, and forming a spacer laterally between the airgap and the contact surface.

In an embodiment of the invention, a device structure is provided for a heterojunction bipolar transistor. The device structure includes a collector in a semiconductor substrate, an intrinsic base on the semiconductor substrate, and an extrinsic base on the intrinsic base. An airgap is located vertically between the extrinsic base and the collector. A contact surface is located adjacent to the airgap. A spacer is located laterally between the airgap and the contact surface.

According to another embodiment of the present invention, a design structure for a heterojunction bipolar transistor is provided that is readable by a machine used in design, manufacture, or simulation of an integrated circuit. The design structure includes a collector in a semiconductor substrate, an intrinsic base on the semiconductor substrate, and an extrinsic base on the intrinsic base. An airgap is located vertically between the extrinsic base and the collector. A contact surface is located adjacent to the airgap. A spacer is located laterally between the airgap and the contact surface. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
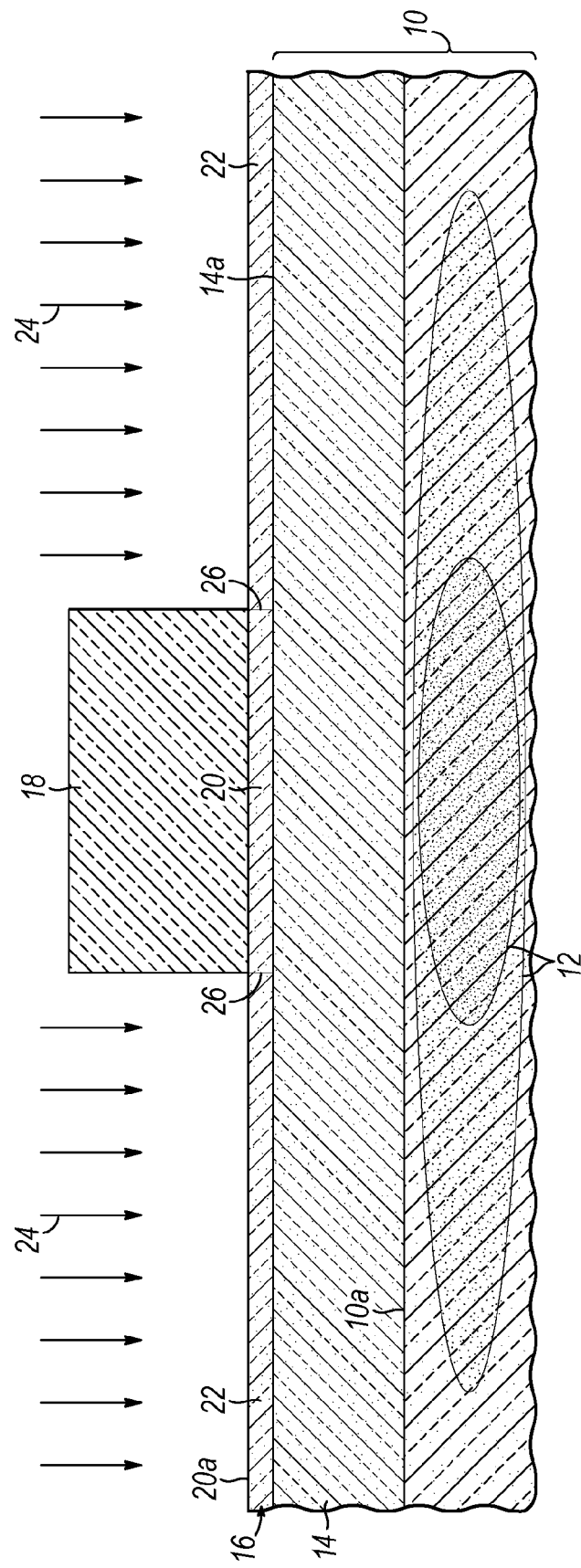
FIGS. 1-9 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single crystal semiconductor material usable to form an integrated circuit. For example, substrate 10 may be comprised of a monocrystalline silicon-containing material, such as a bulk wafer of single crystal silicon or a single-crystal silicon device layer of a silicon-on-insulator wafer. The semiconductor material comprising substrate 10 may be lightly doped to alter its electrical properties.

A subcollector 12 is defined by a doped region in the substrate 10. The subcollector 12 may be formed by introducing an electrically-active dopant, such as a dopant from Group V of the Periodic Table (e.g., phosphorus (P), arsenic (As), or antimony (Sb)) effective to impart n-type conductivity in the host semiconductor material. In one embodiment, the subcollector 12 may be formed by ion implantation of the n-type dopant with an etch mask present and, thereafter, annealing to electrically activate the dopant and to alleviate implantation damage.

The substrate 10 includes an epitaxial layer 14 comprised of semiconductor material. The epitaxial layer 14 may be doped in situ during growth by, for example, chemical vapor deposition to have the same conductivity type as the subcollector 12 and is electrically continuous with the subcollector 12. For example, the epitaxial layer 14 may be comprised of single crystal silicon epitaxially deposited or grown by chemical vapor deposition (CVD) on surface 10a and doped with a concentration of a dopant, such as an impurities species from Group V, effective to impart n-type conductivity. The dopant may be introduced in situ during formation of the epitaxial layer 14 by adding a gas, such as phosphine or arsine, to the CVD reactants. Alternatively, the epitaxial layer 14 may be grown without doping and then doped at a subsequent stage of the processing method by ion implantation.

A semiconductor layer 16 is deposited on the top surface 14a of the epitaxial layer 14. Prior to deposition, the top surface 14a of the epitaxial layer 14 may be cleaned to, for example, remove native oxide. The semiconductor layer 16 may be comprised of a non-single crystal semiconductor material, such as polycrystalline semiconductor material or amorphous semiconductor material. In one embodiment, the semiconductor layer 16 may be comprised of polycrystalline silicon (polysilicon) deposited using rapid thermal chemical vapor deposition (RTCVD) and silane ($SiH_4$) as a source gas. In another embodiment, the semiconductor layer 16 may be comprised of amorphous silicon deposited using plasma-enhanced chemical vapor deposition (PECVD) or low-pressure chemical vapor deposition (LPCVD).

A patterned mask 18 is formed on a top surface 16a of semiconductor layer 16. The mask 18 covers a section 20 of semiconductor layer 16 that is coextensive with the subcollector and vertically aligned with the subcollector 12. The mask 18 may be comprised of a layer of sacrificial material that is applied and photolithographically patterned. To that end, the layer may be comprised of a photoresist that is applied by a spin coating process, pre-baked, exposed to a radiation projected through a photomask, baked after exposure, and developed with a chemical developer to form the patterned mask 18.

Energetic ions, as indicated diagrammatically by the single-headed arrows 24, are introduced using ion implantation into a section 22 of semiconductor layer 16 unmasked by mask 18. The mask 18 operates as an ion-implantation mask that protects the masked section 20 against receiving an implanted dose of the ions 24. The masked section 20 and the unmasked section 22 join along an edge 26 that is vertically aligned with the edge of the mask 18. The properties of the mask 18 are selected to stop implanted ions from reaching the masked section 20 of semiconductor layer 16. The implantation parameters may be selected to provide a projected range and a range straggle confined within the thickness of semiconductor layer 16 and may be selected to tune the thickness of the implanted region.

Due to the implantation of ions 24, the composition of the unmasked section 22 differs from the composition of the masked section 20. The composition difference promotes an etch rate difference, as discussed below, between the masked section 20 of semiconductor layer 16 and the unmasked section 22 of semiconductor layer 16. In one embodiment, the ions 24 may be positive ions of germanium (Ge) and the germanium concentration of section 22 may be greater than one (1) atomic percent. In an alternative embodiment, the modification to the composition of the semiconductor layer 16 may be provided in situ during growth as described below for semiconductor layer 74.

Figure 2:
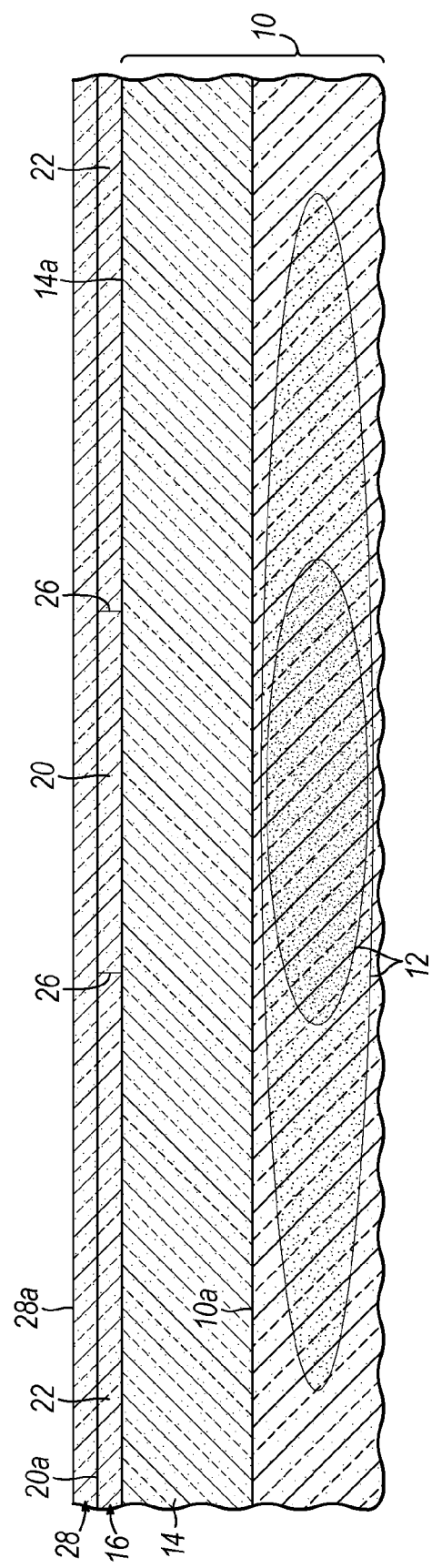

With reference to FIG. 2 in which like reference numerals refer to like features in FIG. 1 and at a subsequent fabrication stage of the processing method, the mask 18 is removed after the section 22 of altered composition is defined. If comprised of a photoresist, the mask 18 may be removed by ashing or solvent stripping, followed by surface cleaning. A semiconductor layer 28 is deposited on the top surface 16a of semiconductor layer 16. In an embodiment, the semiconductor layer 28 may be comprised of a non-single crystal semiconductor material, such as polycrystalline semiconductor material or amorphous semiconductor material. The semiconductor layer 28 may be comprised of polysilicon deposited using RTCVD, or may be comprised of amorphous silicon deposited using PECVD or LPCVD.

Figure 3:
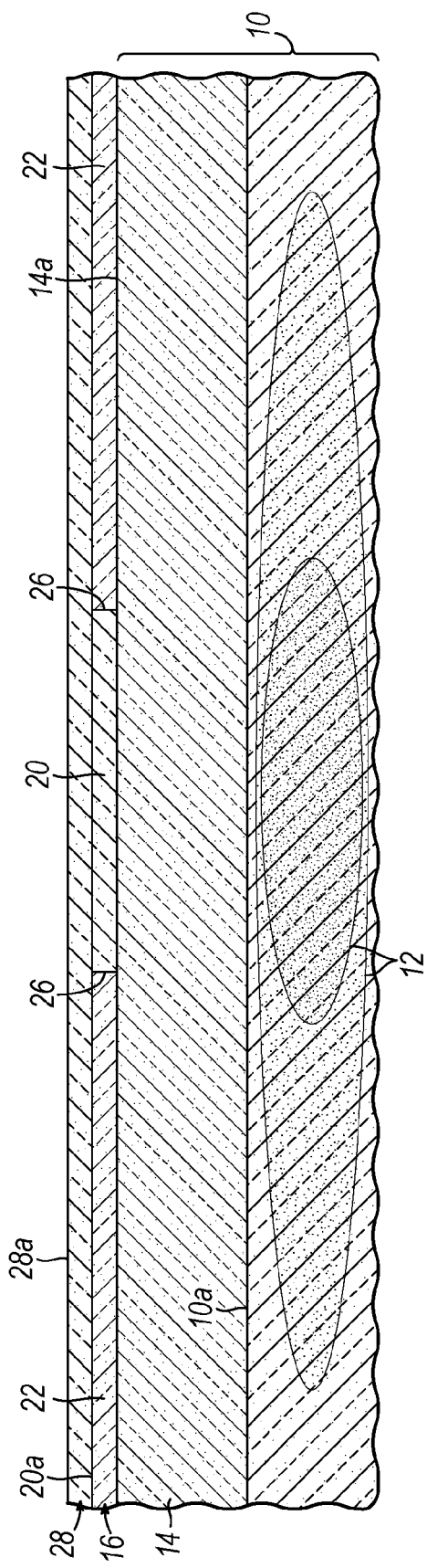

With reference to FIG. 3 in which like reference numerals refer to like features in FIG. 2 and at a subsequent fabrication stage of the processing method, a thermal anneal is used to laterally realign, e.g., regrow or crystallize, the material of semiconductor layer 28 and the material of semiconductor layer 16, including the implanted section 22. The semiconductor layer 16 has an epitaxial relationship with the semiconductor material of the epitaxial layer 14 and the semiconductor layer 28 has an epitaxial relationship with the material of semiconductor layer 16. In the alignment process, the semiconductor layer 16 acquires the crystal structure and orientation of the single crystal semiconductor material of the epitaxial layer 14. To that end, the single crystal material of the epitaxial layer 14 operates as a growth seed for crystalline realignment of the non-single crystal material of the semiconductor layer 16. Similarly, in the alignment process, the semiconductor layer 28 acquires the crystal structure and orientation of the single crystal material of the semiconductor layer 16. The single crystal material of the semiconductor layer 16 operates as a growth seed for crystalline realignment of the non-single crystal material of semiconductor layer 28. The conditions (e.g., time and temperature) for the thermal anneal may be selected to provide complete recrystallization of the layers 16, 28.

Figure 4:
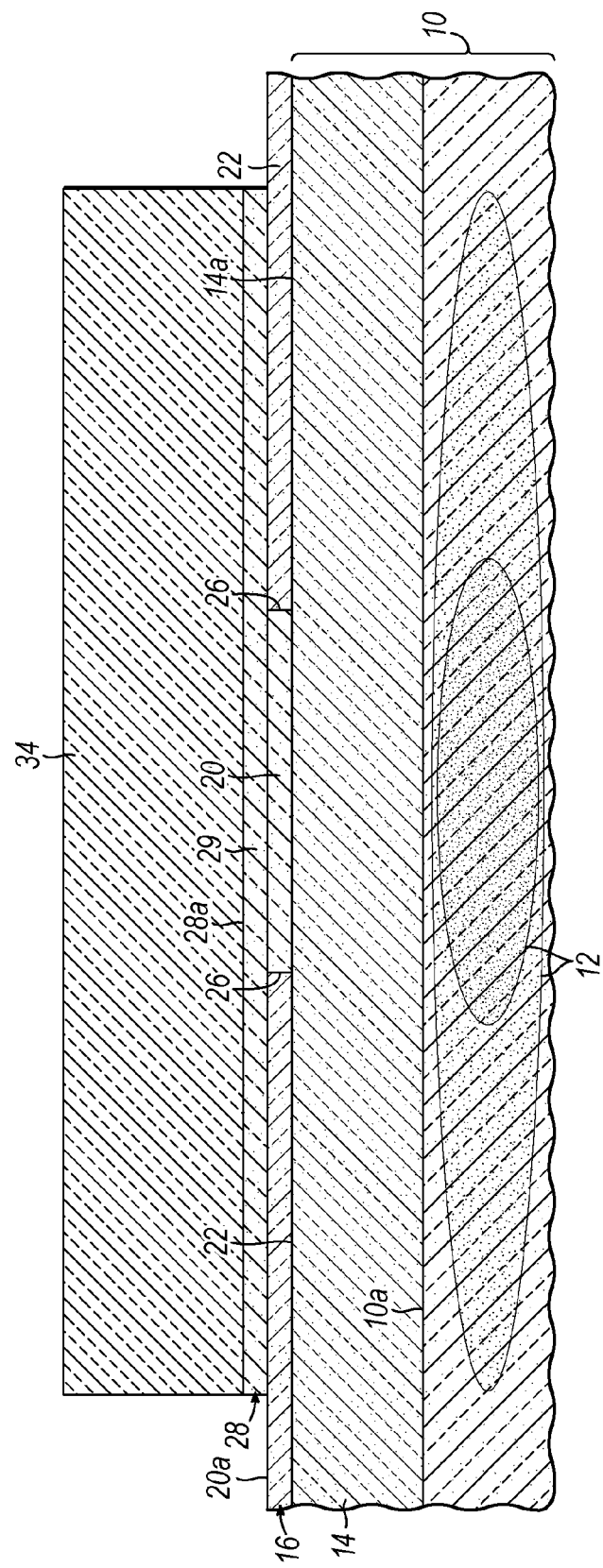

With reference to FIG. 4 in which like reference numerals refer to like features in FIG. 3 and at a subsequent fabrication stage of the processing method, a patterned mask 34 is formed on a top surface 28a of semiconductor layer 28. In the representative embodiment, the mask 34 covers a larger surface area than covered by the mask 18 (FIG. 1) in an earlier fabrication stage and overlaps with the surface area covered by the mask 18 so that the section 20 of semiconductor layer 16 is protected. The mask 34 may be comprised of a layer of sacrificial material that is applied and photolithographically patterned. To that end, the layer may be comprised of a photoresist that is applied by a spin coating process, pre-baked, exposed to a radiation projected through a photomask, baked after exposure, and developed with a chemical developer to form the mask 34. A dry etch process, such as a reactive ion etch (RIE), may be used to remove portions of semiconductor layer 28 that are not protected by the mask 34. The etch process is chosen to remove the material of semiconductor layer 28 selective to the material of semiconductor layer 16. A section 29 of the semiconductor layer 28 covered by the mask 34 remains following the etch process that removes the unprotected portions.

Figure 5:
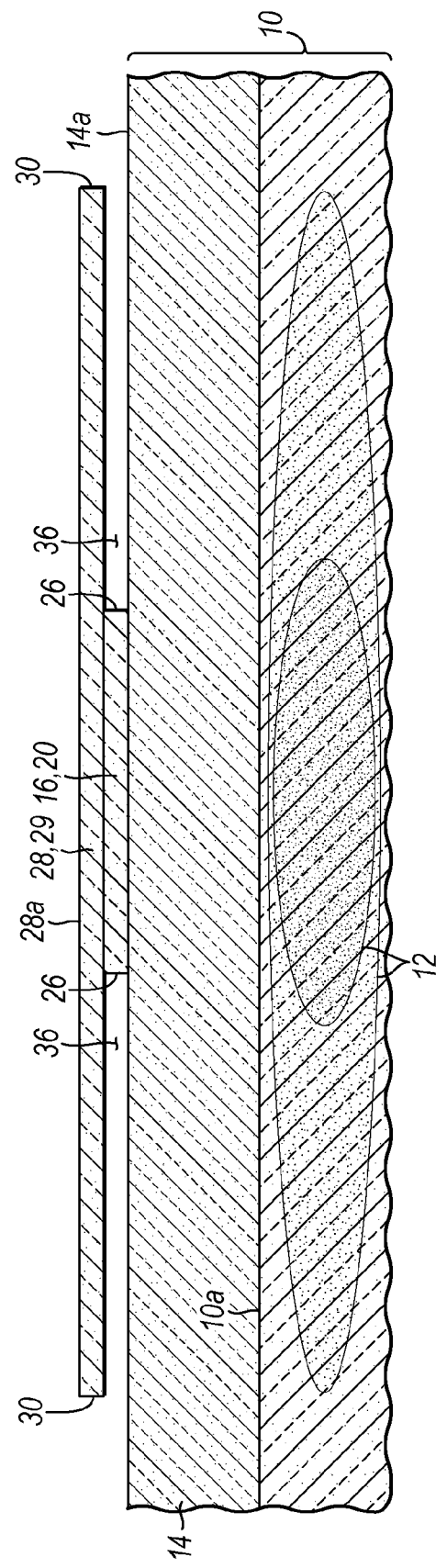

With reference to FIG. 5 in which like reference numerals refer to like features in FIG. 4 and at a subsequent fabrication stage of the processing method, the mask 34 is removed. If comprised of a photoresist, the mask 34 may be removed by ashing or solvent stripping, followed by surface cleaning. A wet chemical etching process may be utilized to remove the material of the implanted section 22 of the semiconductor layer 16 selective to the material of semiconductor layer 28, the semiconductor material of epitaxial layer 14, and the material of the non-implanted section 20 of semiconductor layer 16. The concentration of the element introduced into the implanted section 22 of semiconductor layer 16 is effective to provide the etch rate selectivity.

An airgap 36 is defined between the semiconductor layer 28 and the top surface 14a of the epitaxial layer 14 by the wet chemical etching process. The airgap 36 starts at an edge 30 of section 29 of semiconductor layer 28 and terminates at the edge 26 of section 20 of semiconductor layer 16. The airgap 36 may be characterized by an effective dielectric constant of near unity (about 1.0). The airgap 36 may be filled by air at or near atmospheric pressure, filled by another gas at or near atmospheric pressure, or contain air or another gas at a sub-atmospheric pressure (e.g., a partial vacuum). The extent of the undercut beneath the section 29 of semiconductor layer 28 and dimensions (i.e., the length and width) of the airgap 36 are determined by the relative locations of the edges 26, 30. The height of the airgap 36 measured between the semiconductor layer 28 and the top surface 14a of epitaxial layer 14 will be determined by the thickness of the semiconductor layer 16.

Figure 6:
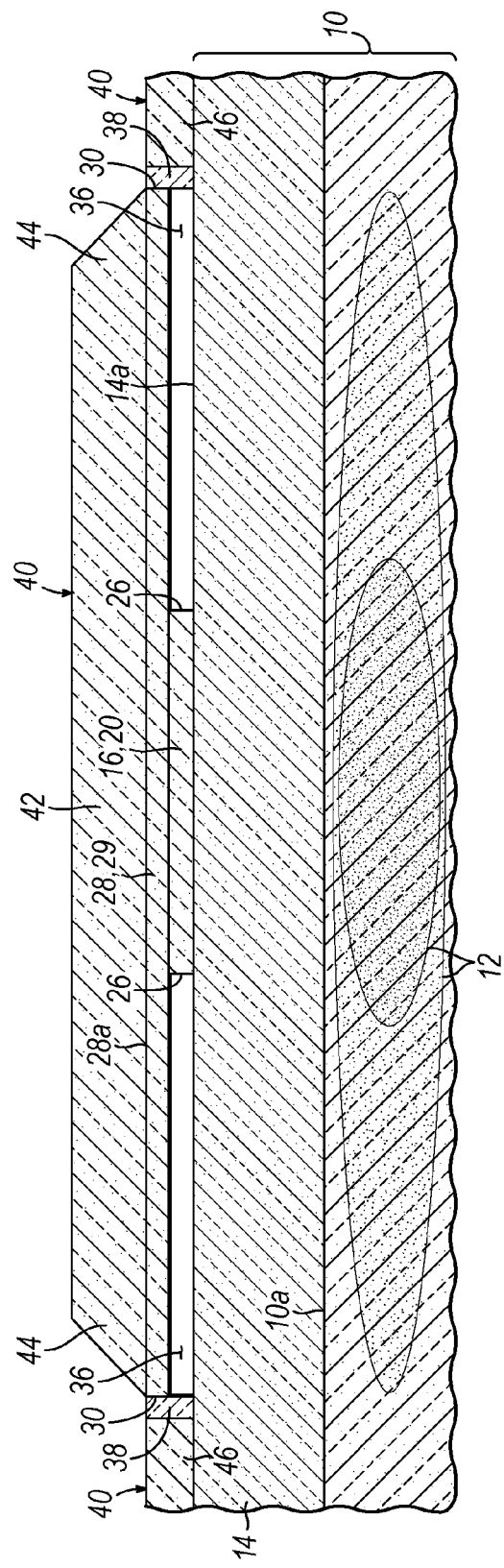

With reference to FIG. 6 in which like reference numerals refer to like features in FIG. 5 and at a subsequent fabrication stage of the processing method, spacers 38 are formed at a periphery of the section 29 of semiconductor layer 28 and have dimensions (e.g., height and thickness) configured to occlude or close an entrance to the airgap 36. The spacers 38 may extend vertically upward from the top surface 14a of epitaxial layer 14 to or above the edge 30 bounding the section 29 of semiconductor layer 28. The spacers 38 may be formed by depositing a conformal layer comprised of an electrical insulator, such as silicon nitride ($Si_3N_4$) deposited by CVD, and shaping the conformal layer with an anisotropic etching process, such as RIE, that preferentially removes the electrical insulator from horizontal surfaces.

An intrinsic base layer 40, which is comprised of a material suitable for forming an intrinsic base of a heterojunction bipolar transistor, is formed as a continuous additive layer on the section 29 of semiconductor layer 28. The intrinsic base layer 40 includes a single crystal section 42 positioned in vertical alignment with the section 29 of semiconductor layer 28. The single crystal section 42 of intrinsic base layer 40 is coupled by the section 20 of semiconductor layer 16 and the section 29 of semiconductor layer 28 with the top surface 14a of epitaxial layer 14. The intrinsic base layer 40 further includes facets 44 that terminate at a location nominally coinciding with (i.e., coterminous with) the location of the edge 30 and that surround the single crystal section 42. Due to this coterminous relationship, the collective width of the single crystal section 42 and the facets 44 of the intrinsic base layer 40 is approximately equal to the width of the section 29 of semiconductor layer 28. The lateral location of edge 30 determines the location for the terminus of the facets 44. The facets 44 are laterally displaced to a position in space outside of the area of the active device region in the finished device.

The intrinsic base layer 40 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 40 may be uniform or the germanium content of intrinsic base layer 40 may be graded and/or stepped across the thickness of intrinsic base layer 40. If the germanium content is stepped, a thickness of the intrinsic base layer 40, such as a thickness directly contacting semiconductor layer 28, may not contain any germanium and may be entirely comprised of silicon (Si). The intrinsic base layer 40 may be doped with one or more species, such as boron either with or without carbon.

Intrinsic base layer 40 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) epitaxially grows in single crystal section 42 disposed on the section 29 of semiconductor layer 28. The crystal structure of single crystal material of the semiconductor layer 28 serves as a crystalline template for the growth of the crystal structure of the single crystal section 42 of intrinsic base layer 40. The spacers 38 occlude the entrance to the airgap 36 so that the semiconductor material does not infiltrate into the airgap 36 during the epitaxial growth process.

A field region 46 of the intrinsic base layer 40 forms on the top surface 14a of epitaxial layer 14. In an embodiment, the field region 46 of the intrinsic base layer 40 may cooperate with the spacers 38 to occlude the entrance to the airgap 36 in the completed device construction. The single crystal section 42 and field region 46 of intrinsic base layer 40 are discontinuous and are disposed in different planes relative to the top surface 14a of epitaxial layer 14. In particular, the single crystal section 42 is raised relative to the field region 46.

Figure 7:
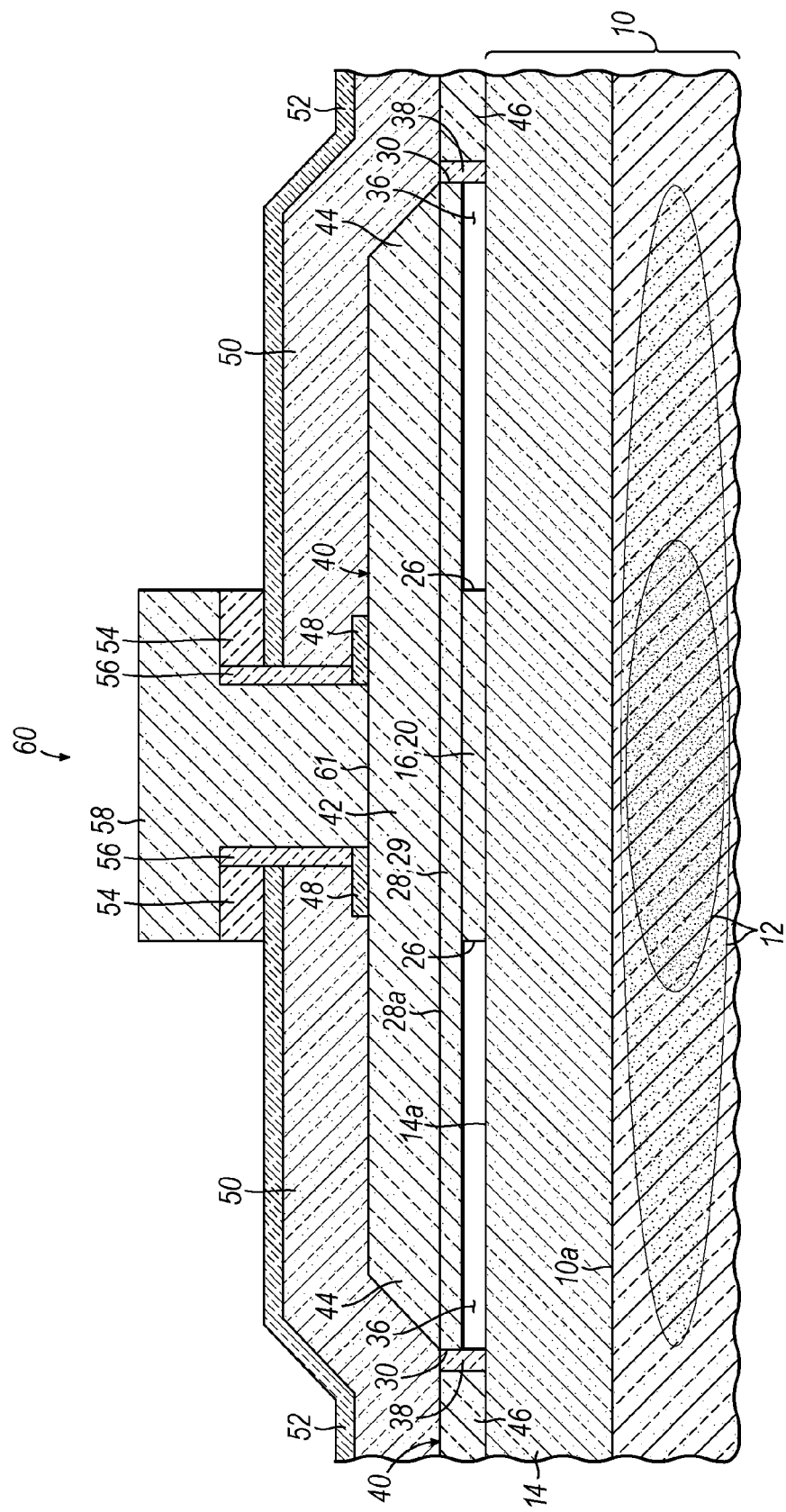

With reference to FIG. 7 in which like reference numerals refer to like features in FIG. 6 and at a subsequent fabrication stage of the processing method, a dielectric layer 48 is applied and patterned to leave a pad at the intended location of an emitter and an opening to the intrinsic base layer 40. An extrinsic base layer 50 is formed that is coupled through the opening in the dielectric layer 48 with the intrinsic base layer 40. In one embodiment, the extrinsic base layer 50 may be comprised of polycrystalline semiconductor material (e.g., polysilicon or polycrystalline SiGe deposited by CVD process. If the extrinsic base layer 50 is comprised of SiGe, the concentration of Ge may have a graded or an abrupt profile and may include additional layers, such as a Si cap layer and/or a Si bottom layer. The extrinsic base layer 50 may be in situ doped with a concentration of a dopant, such as a species from Group III of the Periodic Table (e.g., boron) effective to impart p-type conductivity and may be optionally doped with carbon. As a consequence of the crystalline state of the single crystal section 42 of intrinsic base layer 40, the extrinsic base layer 50 may be comprised of single crystal semiconductor material that relies on the semiconductor material of the intrinsic base layer 40 as a growth seed.

Dielectric layers 52, 54 may then be formed on the extrinsic base layer 50. Dielectric layer 52 may be comprised of an electrical insulator such as silicon nitride ($Si_3N_4$) deposited using CVD. Dielectric layer 54 may be comprised of a different electrical insulator such as silicon dioxide ($SiO_2$) deposited using CVD.

Dielectric layers 52, 54 are patterned using photolithography and etching processes to define an emitter opening that is aligned with a portion of the epitaxial layer 14 that will define a collector of the device structure. To that end, a patterned etch mask is applied to the dielectric layer 54. In one embodiment, the etch mask may be comprised of a sacrificial material, such as a photoresist, applied by spin coating as a layer on dielectric layer 54. The photolithography process that patterns the photoresist layer exposes the photoresist to radiation imaged through a photomask and develops the resulting latent feature pattern in the exposed photoresist to define a window at the intended location for the emitter opening. The etching process relies on an etch chemistry effective to remove the material of the dielectric layers 52, 54 within the window and stops on the extrinsic base layer 50. After the window is formed, the etch mask is removed. If comprised of photoresist, the etch mask may be removed by oxygen plasma ashing or chemical stripping.

The opening is extended by a controlled etching process, such as RIE, through the thickness of the extrinsic base layer 50 using the patterned dielectric layers 52, 54 as a hardmask. Non-conductive spacers 56 are formed inside the emitter opening and extend vertically to the dielectric layer 48. The spacers 56 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

The emitter opening is extended through the pad defined by dielectric layer 48 and an emitter 58 of a heterojunction bipolar transistor 60 is formed in the emitter opening. The emitter 58 may be formed from a layer of semiconductor material that is deposited and then patterned using photolithography and etching processes. The photolithography process may form an etch mask of photoresist that protects only a strip of the semiconductor material aligned with and filling the emitter opening. An etching process, such as RIE, is used to fashion the emitter 58 from the protected strip of semiconductor material. The etching process may also etch the dielectric layer 54 using a suitable etch chemistry and stop on the material of dielectric layer 52. The etch mask is subsequently removed.

The emitter 58 is electrically and physically coupled with the intrinsic base layer 40. A head of the emitter 58 protrudes out of the emitter opening. The non-conductive spacers 56 encircle or surround the emitter 58 so that the emitter 58 is electrically isolated from the extrinsic base layer 50. The base of the emitter 58 directly contacts the top surface of intrinsic base layer 40 along a junction 61.

The emitter 58 of the heterojunction bipolar transistor 60 may be formed from a layer of a heavily-doped semiconductor material that is deposited and then patterned using photolithography and etching processes. For example, the emitter 58 may be comprised of polysilicon or polycrystalline silicon-germanium deposited by CVD or LPCVD and heavily doped with a concentration of a dopant, such as a species from Group V of the Periodic Table, effective to impart n-type conductivity. The heavy-doping level reduces the resistivity of the polysilicon or polycrystalline silicon-germanium, and may be introduced by in situ doping that adds a dopant gas, such as phosphine or arsine, to the CVD reactant gases.

Figure 8:
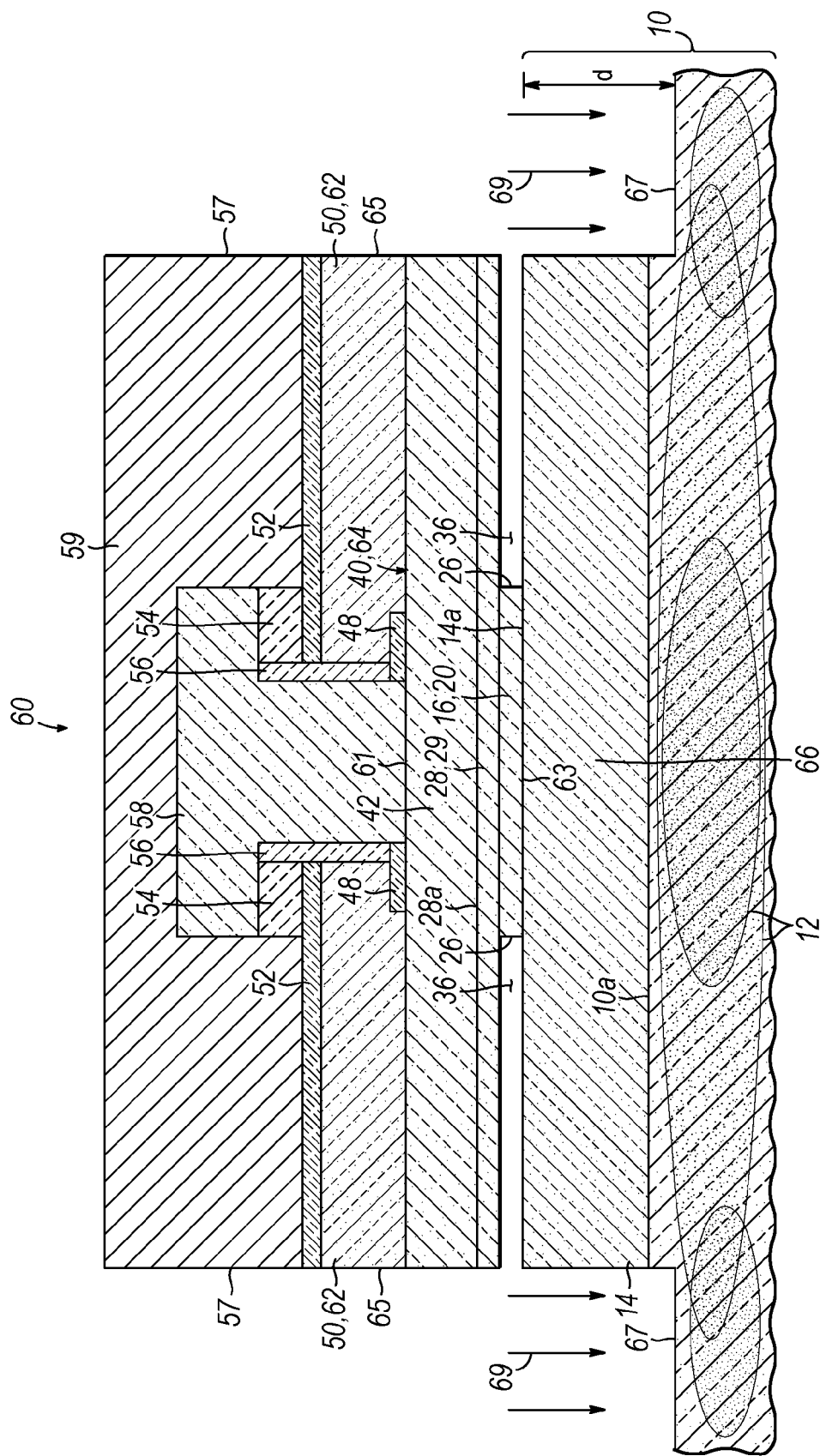

With reference to FIG. 8 in which like reference numerals refer to like features in FIG. 7 and at a subsequent fabrication stage of the processing method, the dielectric layer 52, intrinsic base layer 40, and extrinsic base layer 50 may be lithographically patterned using an etch mask 59 and etching processes, such as RIE, with suitable etch chemistries. The patterning of the extrinsic base layer 50 removes an unmasked portion of the extrinsic base layer 50 peripheral to a sidewall 57 of the etch mask 59 and leaves behind a masked portion that defines an extrinsic base 62 of the heterojunction bipolar transistor 60. The extrinsic base 62 has a sidewall 65 that is coplanar with the sidewall 57 of the etch mask 59. The intrinsic base 64 comprises a portion of the section 42 of intrinsic base layer 40 that is masked by etch mask 59 during the etching process. Unmasked portions of the intrinsic base layer 40 peripheral to the etch mask 59, including the facets 44, are removed by the etching process.

The etching process may also at least partially remove an unmasked portion of the epitaxial layer 14 peripheral to the sidewall 57 of the etch mask 59 and truncate a masked portion of the epitaxial layer 14. A collector 66 of the heterojunction bipolar transistor 60 is defined as all or a portion of the truncated epitaxial layer 14. The collector 66 may be considered to include the section 20 of semiconductor layer 16 and the section 29 of semiconductor layer 28. A junction 63 is defined at the interface between the collector 66 and the section 29 of semiconductor layer 28. The heterojunction bipolar transistor 60 occupies a device region, which can be divided into an intrinsic device region coinciding with the portions of the emitter 58, intrinsic base 64, and collector 66 participating in the junctions 61, 63, and an extrinsic device region outside of the intrinsic device region.

In the representative embodiment, the etching process may remove the epitaxial layer 14 and recess the surface 10a upon which the epitaxial layer 14 was grown. Alternatively, the etching process may be timed to stop at the surface 10a, or may stop without completely removing the epitaxial layer 14 so that a partial thickness of the epitaxial layer 14 remains.

A contact surface 67 is defined peripheral to the adjacent sidewalls of the truncated epitaxial layer 14. The subcollector 12 couples the collector 66 with the contact surface 67 so that electrical contact can be established with the collector 66. The contact surface 67 is formed a distance away from the collector 66, and defines the access to a reachthrough portion of the subcollector 12. To enhance the conductivity of the substrate 10 beneath the contact surface 67, an optional implantation with ions, as indicated diagrammatically by the single-headed arrows 69, may be used to introduce a dopant, such as the same type of dopant forming the subcollector 12, into the substrate 10 outside of the mask 59. The airgaps 36 are raised relative to the plane of the contact surface 67 by a distance, d.

The airgaps 36 define electrical isolation for the heterojunction bipolar transistor 60 that replaces shallow trench isolation regions, which are absent from the device construction. The reduction in the dielectric constant afforded by the airgaps 36 beneath the extrinsic base 62 and intrinsic base 64, as compared with solid dielectric material filling intervening trench isolation regions, may operate to improve device performance by reducing the parasitic subcollector-to-extrinsic base parasitic capacitance. The elimination of shallow trench isolation regions also reduces thermal resistance so that heat can be more efficiently removed from the heterojunction bipolar transistor 60 and dissipated during operation.

The heterojunction bipolar transistor 60 has a vertical architecture in which the intrinsic base 64 is located between the emitter 58 and the collector 66, and in which the emitter 58, the intrinsic base 64, and the collector 66 are vertically arranged. The conductivity type of the semiconductor material constituting the emitter 58 and the collector 66 is opposite to the semiconductor material constituting the intrinsic base 64. The extrinsic base 62 is coupled with section 42 of the intrinsic base 64 and is located peripheral to the emitter 58.

Figure 9:
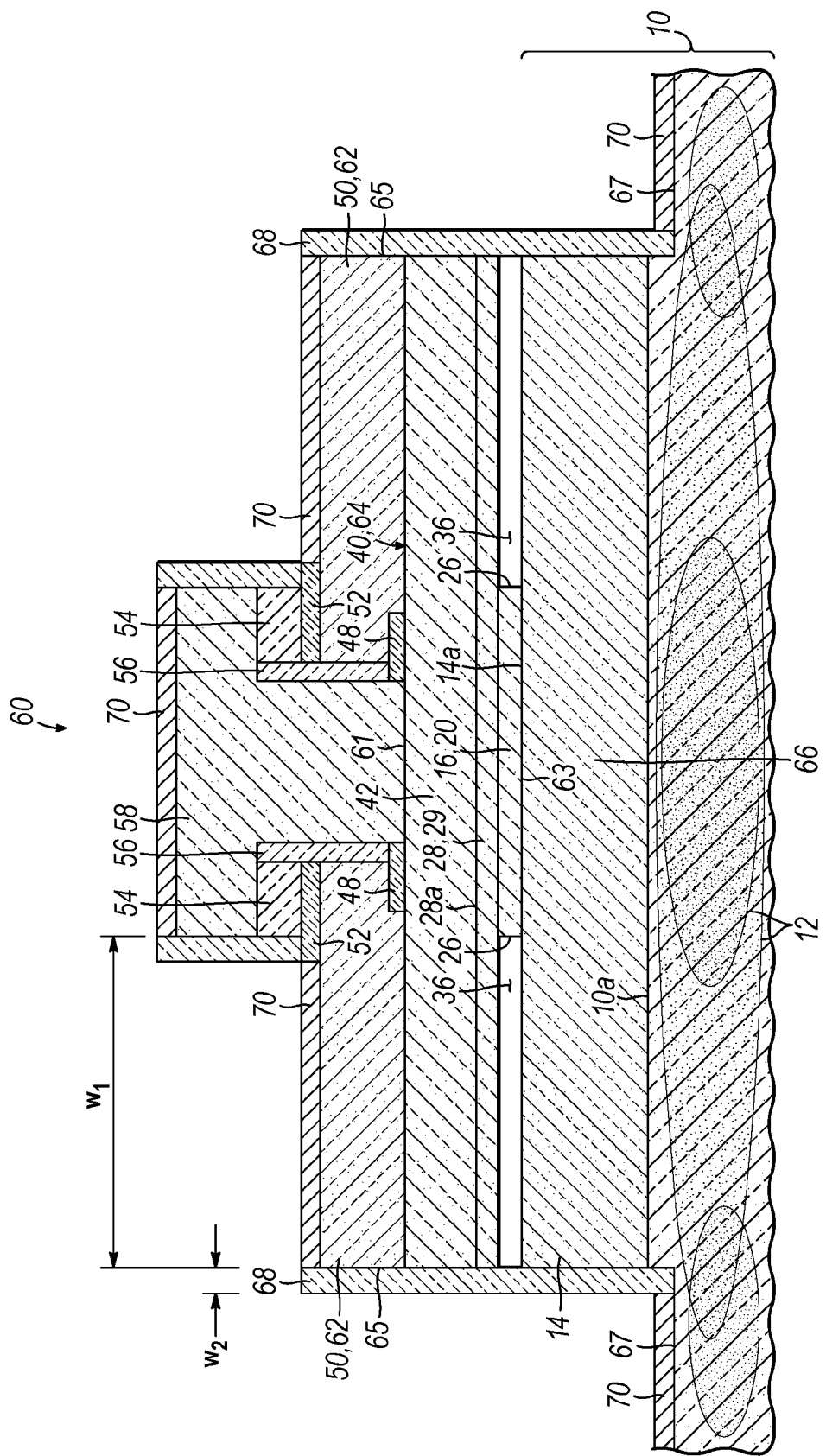

With reference to FIG. 9 in which like reference numerals refer to like features in FIG. 8 and at a subsequent fabrication stage of the processing method, spacers 68 are formed from a dielectric layer comprised of, for example, $Si_3N_4$. After the dielectric layer is deposited, sections of the dielectric layer are removed from horizontal surfaces using a directional etch such as, for example, RIE, to define the spacers 68. A final dopant activation anneal may be performed and a silicide layer 70 is formed at the locations of the removed sections of the dielectric layer. Spacers 68 are located laterally between the airgaps 36 and the contact surface 67, and operate to close or occlude the airgaps 36. In particular, the contact surface 67 is laterally spaced from the portion of the collector 66 in the active device region by the width, $w_1$, of the airgap 36 and a width, $w_2$, of the spacer 68 formed adjacent to the airgap 36.

Standard middle-end-of-line and back-end-of-line processing ensues, which includes formation of contacts and wiring for the local interconnect structure overlying the heterojunction bipolar transistor 60, and formation of dielectric layers, via plugs, and wiring for an interconnect structure coupled by the interconnect wiring with the heterojunction bipolar transistor 60, as well as other similar contacts for additional device structures like heterojunction bipolar transistor 60 and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

Figure 10:
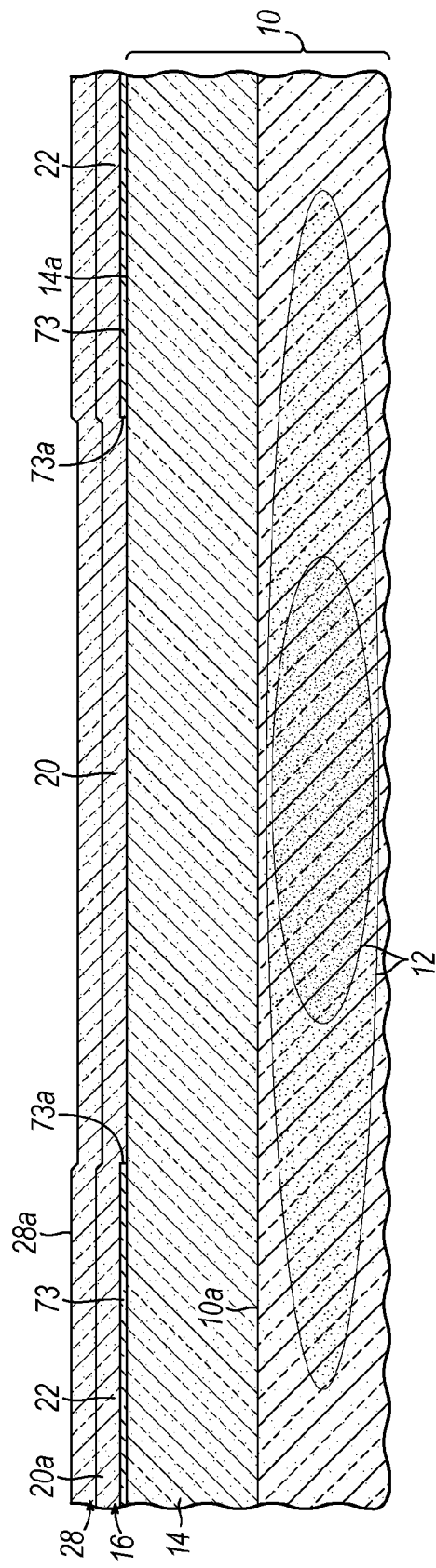
FIG. 10 is a cross-sectional view similar to FIG. 1 of a substrate portion for fabricating a device structure in accordance with an alternative embodiment of the invention.

With reference to FIG. 10 in which like reference numerals refer to like features in FIG. 1 and in accordance with an alternative embodiment, a dielectric layer 73 may be deposited on the epitaxial layer 14 and patterned to open the top surface 14a of the epitaxial layer 14 in the active device region. After the dielectric layer 73 is deposited and patterned, the semiconductor layer 16 is formed and the patterned mask 18 is formed on the top surface 16a of semiconductor layer 16. The mask 18 covers a smaller surface area than the surface area opened when the dielectric layer 73 is patterned. After the mask 18 is applied, the ions 24 are implanted as described in connection with FIG. 1 and the semiconductor layer 28 is deposited as described in connection with FIG. 2.

The processing method continues with the fabrication stages of FIGS. 3-9 to form the heterojunction bipolar transistor 60. In particular, the semiconductor layers 16, 28 are realigned as described in connection with FIG. 3. However, an edge 73a of the dielectric layer 73 that adjoins a section of the semiconductor layer 28 will establish a boundary for the realignment of the semiconductor layers 16, 28. The mask 34 (FIG. 4) covers a smaller surface area than the surface area opened when the dielectric layer 73 is patterned. As a result, a path exists adjacent to the edge 73a for the wet chemical etching process to access and remove the material of the implanted section 22 of the semiconductor layer 16 selective to the material of semiconductor layer 28, the semiconductor material of epitaxial layer 14, and the material of the non-implanted section 20 of semiconductor layer 16. As a result, the airgap 36 is defined between the semiconductor layer 28 and the top surface 14a of the epitaxial layer 14.

Figure 11:
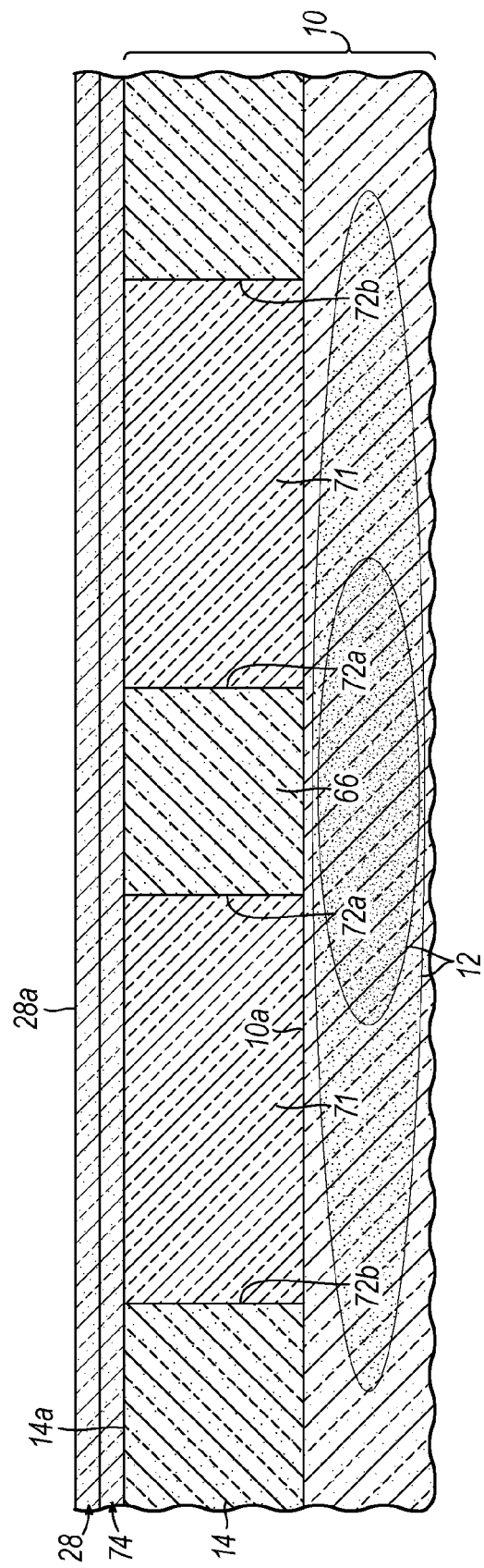
FIGS. 11-17 are cross-sectional views of a substrate portion at successive fabrication stages of a processing method for fabricating a device structure in accordance with another alternative embodiment of the invention.

With reference to FIG. 11 in which like reference numerals refer to like features in FIG. 1 and in accordance with an alternative embodiment, trench isolation regions 71 are provided in the substrate 10 and include sidewalls 72a, 72b. Sidewalls 72a circumscribe and border the collector 66. Sidewalls 72b are separated from the collector 66 by the full width of each trench isolation region 71. The trench isolation regions 71 may be formed by a shallow trench isolation (STI) technique that uses on a lithography and dry etching process to define trenches, deposits an electrical insulator to fill the trenches, and planarizes the electrical insulator using a chemical mechanical polishing (CMP) process. The electrical insulator may be comprised of an oxide of silicon, such as tetraethylorthosilicate (TEOS) deposited by CVD.

A semiconductor layer 74 and the semiconductor layer 28 are successively deposited or grown as a layer stack on the epitaxial layer 14. The semiconductor layer 74, which is similar to semiconductor layer 16, may be deposited or grown with a modified composition as opposed to deposition followed by ion implantation. For example, the semiconductor material of semiconductor layer 74 may comprise SiGe, carbon-doped Si, or carbon-doped SiGe with a composition that is primarily silicon and may include an n-type dopant or a p-type dopant. The concentration of the minority element in semiconductor layer 74 (e.g., Ge and/or C), which is introduced in situ during the deposition, is effective to provide an etch rate greater than an etch rate of the semiconductor layer 28. In an alternative embodiment, the modification to the composition of the semiconductor layer 74 may be provided by ion implantation as described above for semiconductor layer 16.

Figure 12:
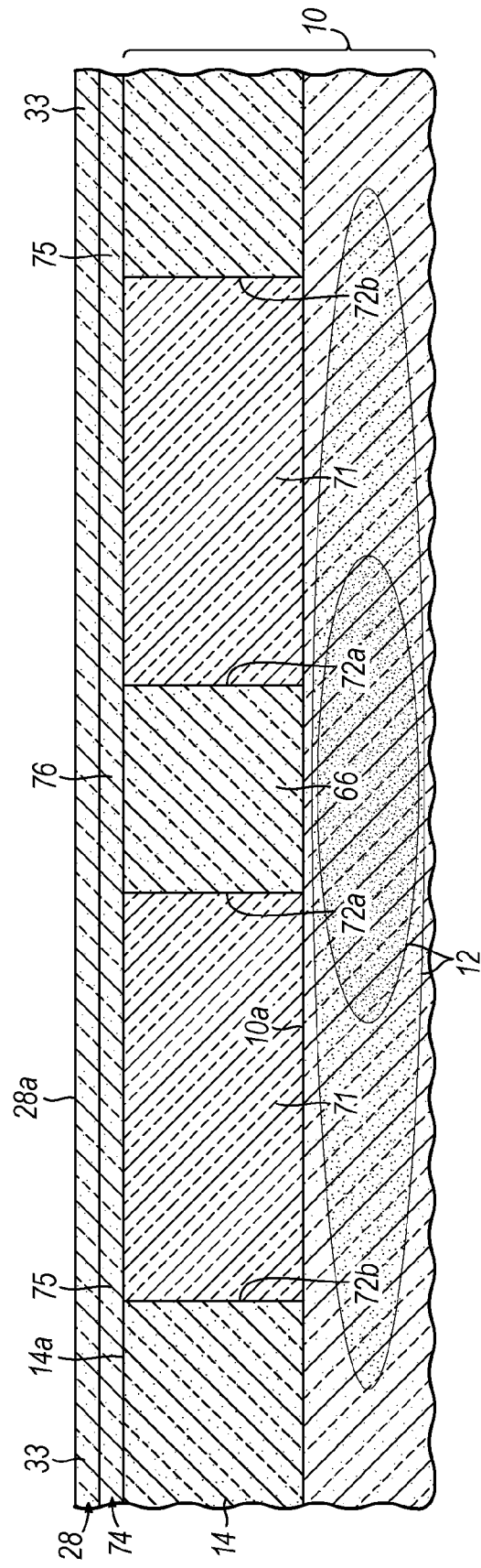

With reference to FIG. 12 in which like reference numerals refer to like features in FIG. 11 and at a subsequent fabrication stage of the processing method, a thermal anneal is used to realign, e.g., regrow or crystallize, the material of semiconductor layer 28 and the material of semiconductor layer 74 as described above in connection with FIG. 3.

Figure 13:
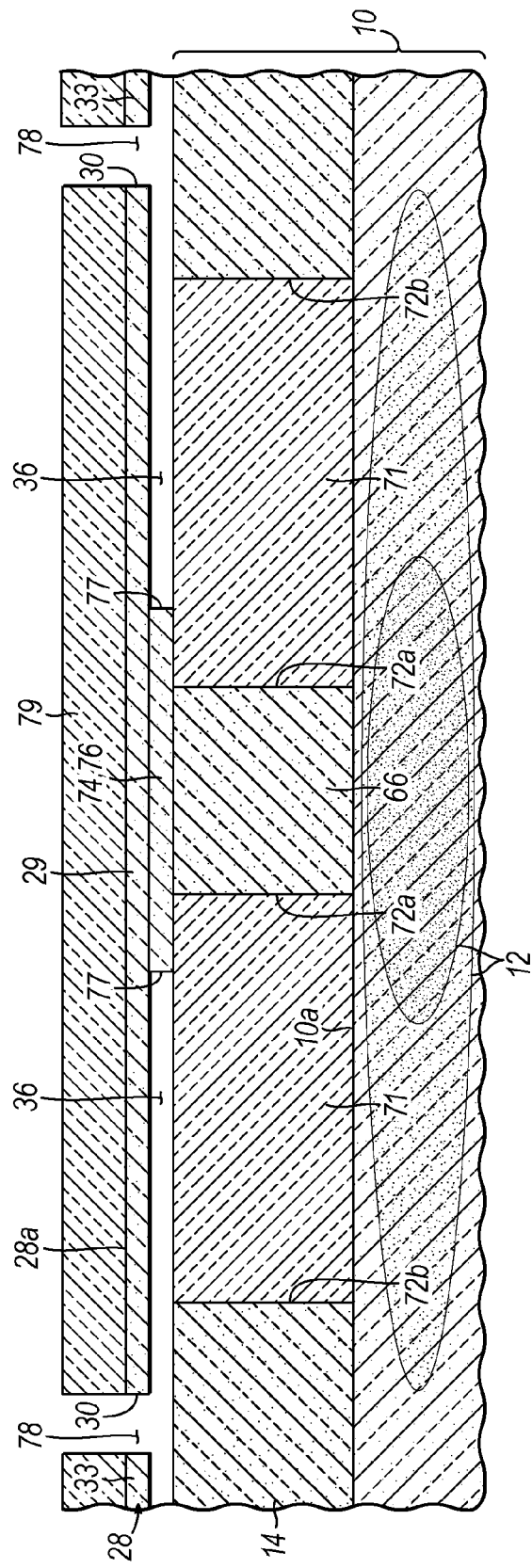

With reference to FIG. 13 in which like reference numerals refer to like features in FIG. 12 and at a subsequent fabrication stage of the processing method, a patterned hardmask 79 is applied to semiconductor layer 28 and openings 78 are defined that extend through semiconductor layer 28. The openings 78 may be formed in semiconductor layer 28 by a dry etch process, such as RIE. The openings 78 in semiconductor layer 28 are located over the epitaxial layer 14 and in a reachthrough region peripherally outside of the sidewall 71b of each the trench isolation region 71 that is eventually used to form the contact surface 67.

The semiconductor layer 74 is etched with a timed wet etch process to remove its constituent material and to thereby define the airgaps 36. To perform the timed etch process, access for the wet chemical etchant to the semiconductor layer 74 is provided by the openings 78 defined in semiconductor layer 28. The etch chemistry is selected to remove the semiconductor material of semiconductor layer 74 selective to the material of semiconductor layer 28 and the semiconductor material of the epitaxial layer 14. Following the timed etch, a section 76 of semiconductor layer 74 remains that terminates at an edge 77.

Figure 14:
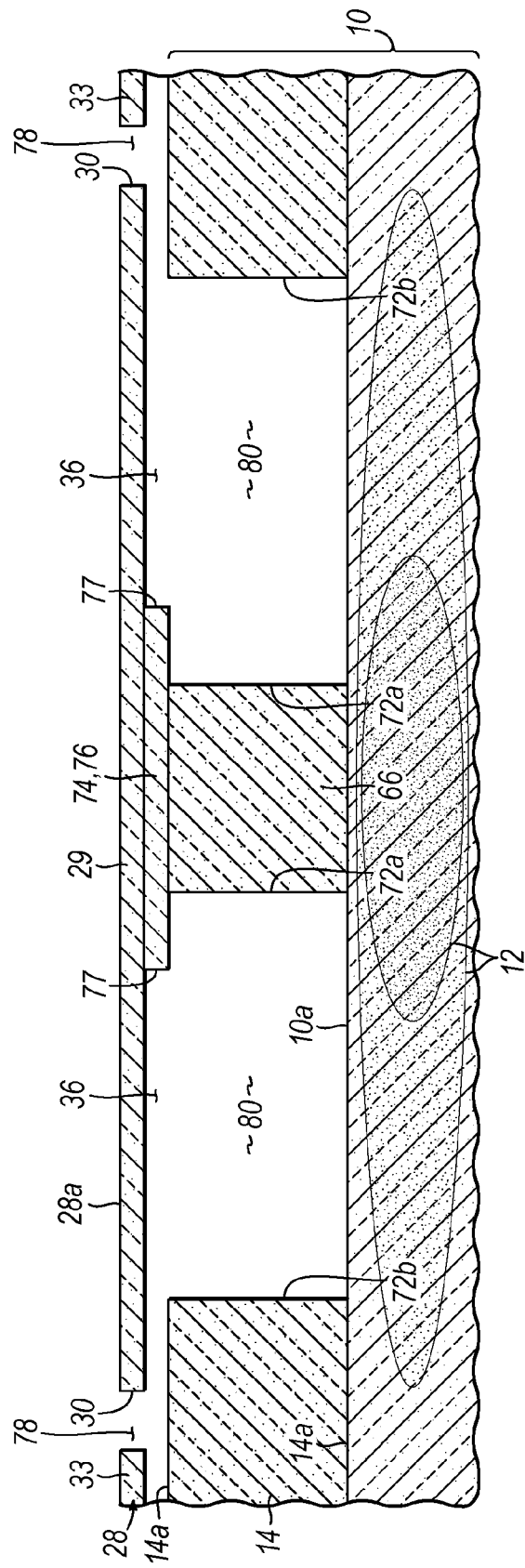

With reference to FIG. 14 in which like reference numerals refer to like features in FIG. 13 and at a subsequent fabrication stage of the processing method, airgaps 80 are defined that extend laterally beneath the semiconductor layer 28 and the section 76 of semiconductor layer 74. The airgaps 80 may have the same geometrical shape and dimensions as the trench isolation regions 71, which are removed to form the airgaps 80. The airgaps 80 may have an effective dielectric constant of near unity (about 1.0). The airgaps 80 may be filled by air at or near atmospheric pressure, filled by another gas at or near atmospheric pressure, or contain air or another gas at a sub-atmospheric pressure (e.g., a partial vacuum). The space defined by airgaps 36 is merged with the space defined by airgaps 80 to define airgaps of a collectively larger volume. The definition of the airgaps 80 effectively enlarges the airgaps 36.

An isotropic etching process, such as a wet chemical etching process, may be applied to at least partially remove the trench isolation regions 71 from beneath the semiconductor layer 28 and the section 76 of semiconductor layer 74. In the representative embodiment, the trench isolation regions 71 are completely removed from their respective trenches. If the trench isolation regions 71 are comprised of an oxide of silicon, the wet chemical etching process may utilize a wet chemical etchant comprising buffered hydrofluoric acid (BHF) or diluted hydrofluoric acid (DHF). The etchant accesses the trench isolation regions 71 through the openings 78, and the spent etchant and removed dielectric material are extracted through the openings 78. The etching process removes the dielectric material selective to the semiconductor materials comprising the epitaxial layer 14 and the semiconductor layers 28, 74.

Figure 15:
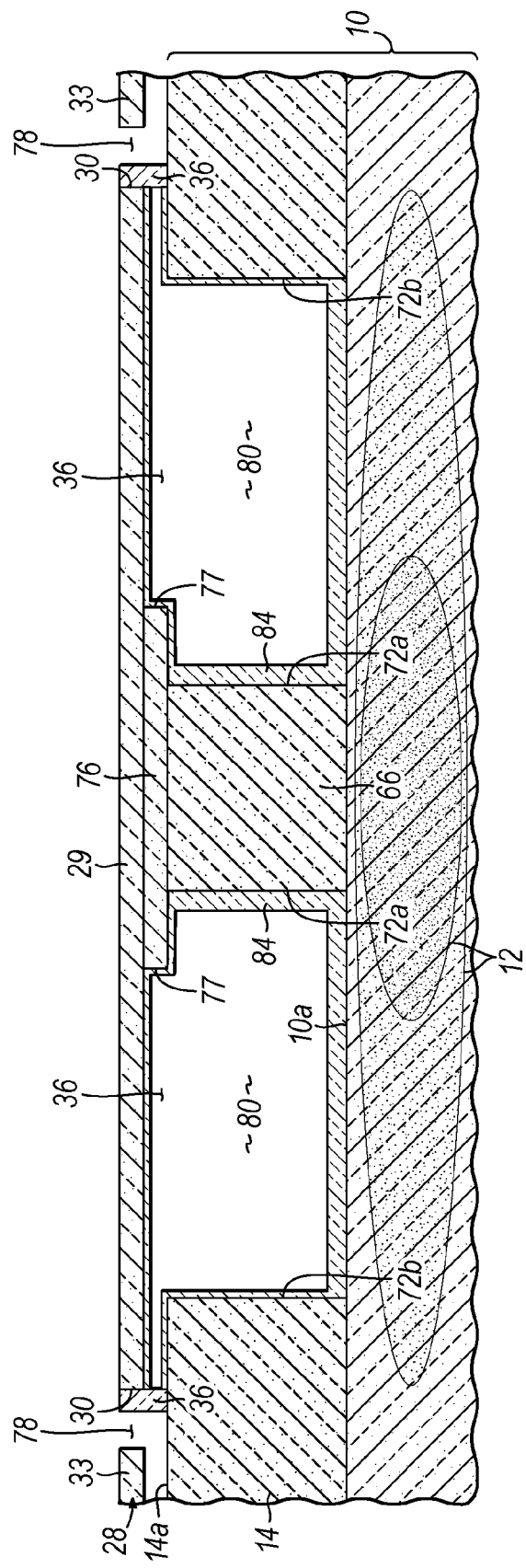

With reference to FIG. 15 in which like reference numerals refer to like features in FIG. 14 and at a subsequent fabrication stage of the processing method, a passivation layer 84 is formed as a cladding on the surfaces of the substrate 10, the semiconductor layer 28 bordering the airgaps 36, the section 76 of semiconductor layer 74 bordering the airgaps 36, 80, and the other surfaces of the substrate 10 surrounding the airgaps 36, 80. The passivation layer 84 may be comprised of a dielectric material, such as an insulator like $SiO_2$ grown using rapid thermal oxidation or non-conformally deposited, and serves to passivate the various semiconductor materials surrounding the airgaps 36, 80.

Figure 16:
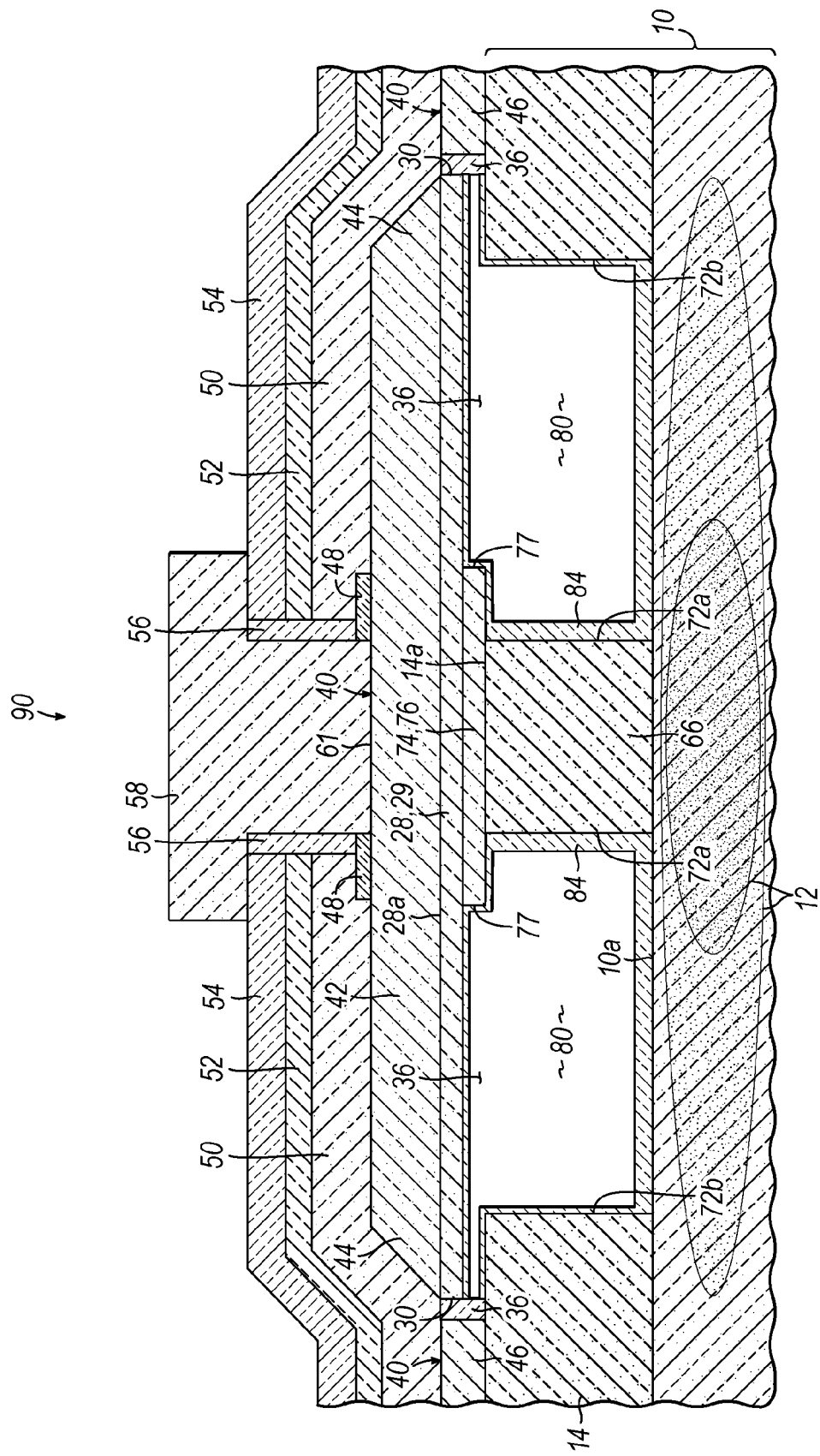

With reference to FIG. 16 in which like reference numerals refer to like features in FIG. 15 and at a subsequent fabrication stage of the processing method, the sequence of the processing method continues as described in FIGS. 6, 7 to form the heterojunction bipolar transistor 90.

Figure 17:
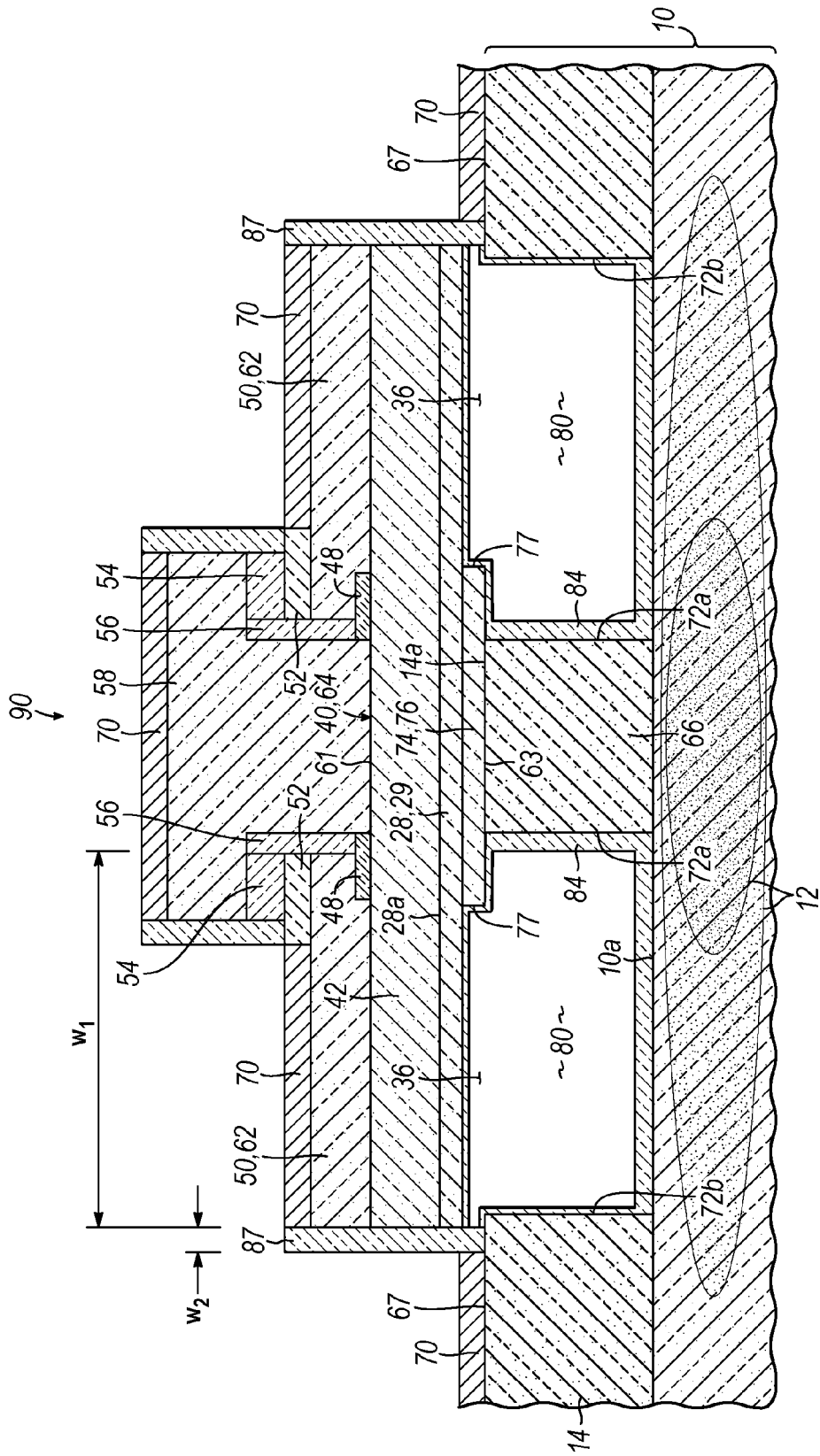

With reference to FIG. 17 in which like reference numerals refer to like features in FIG. 16 and at a subsequent fabrication stage of the processing method, the sequence of the processing method continues as described in FIGS. 8 and 9 to, among other things, form the contact surface 67 and apply the spacers 68. The contact surface 67 is laterally spaced from the portion of the collector 66 in the active device region by the width, $w_1$, of the airgap 36, 80 and a width, $w_2$, of the spacer 68 formed adjacent to the airgap 36, 80. An optional stress layer may be added that introduces an external source of stress into the construction of the heterojunction bipolar transistor 60.

Figure 18:
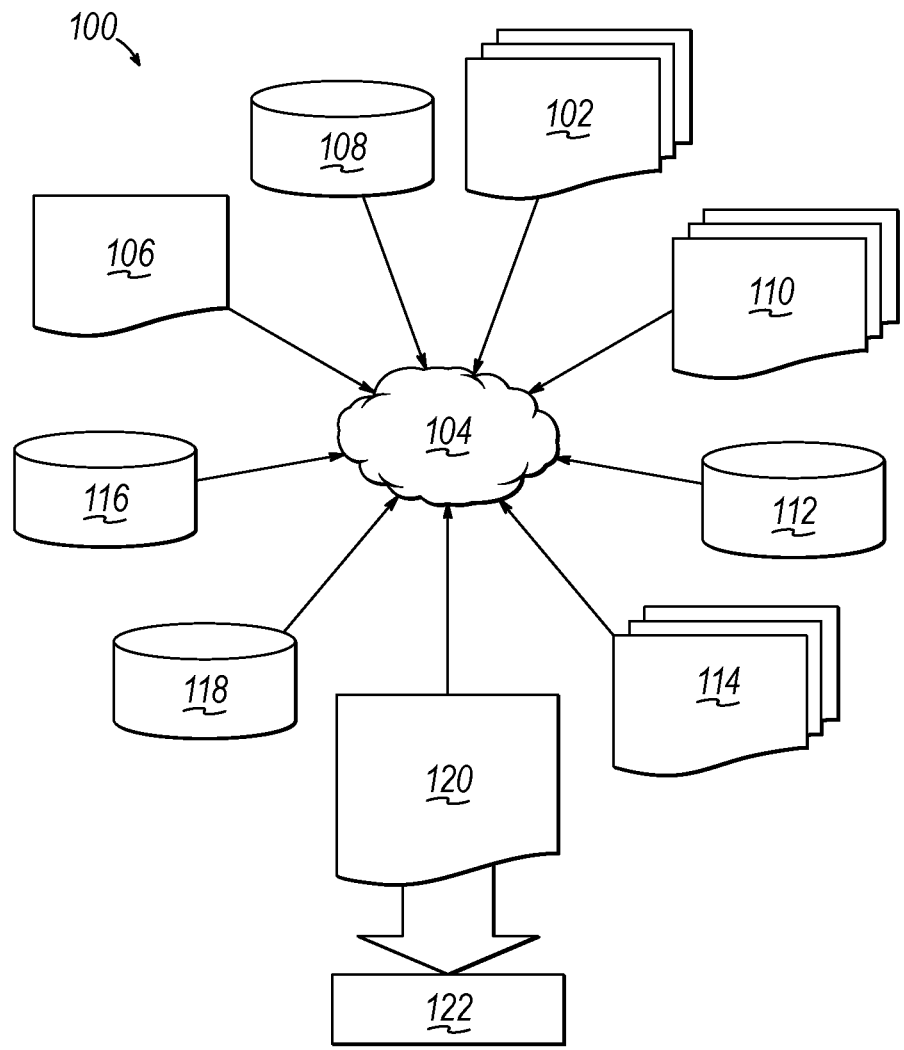
FIG. 18 is a flow diagram of a design process used in semiconductor design, manufacture, and/or test.

FIG. 18 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-17. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-17. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-17 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 120 may comprise a compiled, executable HDL simulation model that functionally simulates the devices shown in FIGS. 1-17.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 120 may then proceed to a stage 122 where, for example, design structure 120: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a device structure for a heterojunction bipolar transistor, the method comprising:
   forming a collector in a semiconductor substrate;
   forming an intrinsic base layer on the semiconductor substrate;
   forming an extrinsic base layer on the intrinsic base layer;
   forming an airgap vertically between the extrinsic base layer and the collector;
   defining a contact surface for the collector and adjacent to the airgap; and
   forming a first spacer laterally between the airgap and the contact surface.

2. The method of claim 1 wherein the airgap is coextensive with a top surface of the semiconductor substrate, and defining the contact surface adjacent to the airgap comprises:
   masking a first portion of the extrinsic base layer, the intrinsic base layer, and the airgap with an etch mask; and
   etching the semiconductor substrate to recess the top surface relative to the airgap and thereby form the contact surface peripheral to the etch mask.

3. The method of claim 2 wherein the first portion of the extrinsic base layer defines an extrinsic base of the heterojunction bipolar transistor, a second portion of the extrinsic base layer peripheral to the etch mask is removed when the semiconductor substrate is etched, and the first portion of the extrinsic base includes a sidewall that is coplanar with a sidewall of the etch mask.

4. The method of claim 3 wherein the first spacer is formed at the edge of the first portion of the extrinsic base and extends vertically to the contact surface, and further comprising:
   before the semiconductor substrate is etched to recess the top surface, forming a second spacer on the top surface of the semiconductor substrate that occludes the airgap.

5. The method of claim 4 wherein the second spacer is removed when the contact surface is defined.

6. The method of claim 1 wherein the first spacer is formed after the contact surface is formed, and the airgap is formed before the contact surface is formed.

7. The method of claim 1 further comprising:
   before the first spacer and the contact surface are formed, forming a trench isolation region located beneath the intrinsic base layer; and
   removing the trench isolation region to enlarge the airgap.

8. The method of claim 7 wherein the trench isolation region borders the collector, and further comprising:
   forming a first semiconductor layer on the semiconductor substrate and the trench isolation region;
   forming a second semiconductor layer on the first semiconductor layer; and
   forming an opening in the second semiconductor layer at a location that is peripherally outside of a sidewall for the trench isolation region.

9. The method of claim 8 wherein forming the airgap vertically between the extrinsic base layer and the collector comprises:
   directing a first wet chemical etchant through the opening to remove a portion of the first semiconductor layer and form the airgap.

10. The method of claim 9 wherein removing the trench isolation region to enlarge the airgap comprises:

directing a second wet chemical etchant through the opening and the airgap to remove the trench isolation region so that the airgap is enlarged.

11. The method of claim 1 wherein forming the airgap comprises:

forming a first semiconductor layer on the semiconductor substrate;

forming a second semiconductor layer on the first semiconductor layer; and removing a portion of the first semiconductor layer from beneath the second semiconductor layer to define the airgap vertically between the second semiconductor layer and the semiconductor substrate.

12. The method of claim 11 further comprising:

forming an emitter that is coupled with the second semiconductor layer by the intrinsic base layer.

13. A device structure for a heterojunction bipolar transistor, the device structure formed using a semiconductor substrate, the device structure comprising:

a collector in the semiconductor substrate;

an intrinsic base on the semiconductor substrate;

an extrinsic base on the intrinsic base;

an airgap vertically between the extrinsic base and the collector;

a contact surface adjacent to the airgap, the contact surface configured to provide electrical contact with the collector; and a spacer laterally between the airgap and the contact surface.

14. The device structure of claim 13 wherein the airgap is coextensive with a top surface of the semiconductor substrate, and the airgap is raised relative to the contact surface.

15. The device structure of claim 13 wherein the airgap has a first portion above a top surface of the semiconductor substrate and a second portion that extends beneath the top surface of the semiconductor substrate.

16. The device structure of claim 15 wherein the second portion of the airgap comprises a trench in the semiconductor substrate, and further comprising:

a passivation layer on a plurality of surfaces of the semiconductor substrate bordering the second portion of the airgap.

17. The device structure of claim 13 further comprising:

a first semiconductor layer on the semiconductor substrate; and a second semiconductor layer on the first semiconductor layer, wherein the airgap is positioned vertically between the second semiconductor layer and the semiconductor substrate, and the intrinsic base is positioned on the second semiconductor layer.

18. The device structure of claim 17 further comprising:

an emitter that is coupled by the first and second semiconductor layers with the intrinsic base.

19. The device structure of claim 13 wherein the contact surface is laterally spaced from the collector by a width of the airgap and a width of the spacer.

20. The device structure of claim 13 wherein the collector has a portion that projects through the airgap, the intrinsic base has an outer edge, and the airgap extends from the portion of the collector to the outer edge of the intrinsic base.

* * * * *